US009688088B2

(12) United States Patent
Lee et al.

(10) Patent No.: US 9,688,088 B2
(45) Date of Patent: Jun. 27, 2017

(54) THERMAL TRANSFER FILM, AND ORGANIC ELECTROLUMINESCENT DEVICE PREPARED USING SAME

(71) Applicant: CHEIL INDUSTRIES INC., Gumi-si, Gyeongsangbuk-do (KR)

(72) Inventors: Jung Hyo Lee, Uiwang-si (KR); Kyoung Ku Kang, Uiwang-si (KR); Si Kyun Park, Uiwang-si (KR); Seong Heun Cho, Uiwang-si (KR); Sung Han Kim, Uiwang-si (KR); Se Hyun Park, Uiwang-si (KR); Eun Su Lee, Uiwang-si (KR); Jin Hee Choi, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 14/655,687

(22) PCT Filed: Dec. 27, 2013

(86) PCT No.: PCT/KR2013/012261
§ 371 (c)(1),
(2) Date: Jun. 25, 2015

(87) PCT Pub. No.: WO2014/104786
PCT Pub. Date: Jul. 3, 2014

(65) Prior Publication Data
US 2015/0336412 A1    Nov. 26, 2015

(30) Foreign Application Priority Data

Dec. 28, 2012  (KR) .................. 10-2012-0157628

(51) Int. Cl.
*B41M 5/46*   (2006.01)
*H01L 51/50*  (2006.01)
(Continued)

(52) U.S. Cl.
CPC .............. *B41M 5/465* (2013.01); *B41M 5/46* (2013.01); *H01L 51/5012* (2013.01);
(Continued)

(58) Field of Classification Search
CPC  B41M 5/46; B41M 2205/30; B41M 2205/34; B41M 2205/36; B41M 2205/38;
(Continued)

(56) References Cited

U.S. PATENT DOCUMENTS 7,387,864 B2 *  6/2008  Felder ................ B41M 5/41
                                                       430/200
7,396,631 B2 *  7/2008  Wright ................ B41M 5/46
                                                       427/514
8,203,125 B2 *  6/2012  Shim ................. B41M 5/465
                                                       106/400

FOREIGN PATENT DOCUMENTS

EP          1 506 938 A2    2/2005
KR    10-2005-0052303 A    6/2005
(Continued)

OTHER PUBLICATIONS

KIPO Office action dated Apr. 10, 2015 in priority Korean priority application No. 10-2012-0157628, 5 pages.
(Continued)

*Primary Examiner* — Bruce H Hess
(74) *Attorney, Agent, or Firm* — Lewis Roca Rothgerber Christie LLP (57) ABSTRACT

The present invention relates to a thermal transfer film comprising: a base layer; and a light-to-heat conversion layer which is laminated on top of the base layer and includes a first layer laminated on top of the base layer and a second layer laminated on top of the first layer in the thickness direction, wherein light-to-heat conversion materials are more omnipresent in the first layer than the second
(Continued)

layer. The present invention also relates to an organic electroluminescent device prepared using said film.

20 Claims, 3 Drawing Sheets (51) Int. Cl.
H01L 51/00 (2006.01)
B41M 5/44 (2006.01)

(52) U.S. Cl.
CPC ............ B41M 5/443 (2013.01); B41M 5/446 (2013.01); B41M 2205/30 (2013.01); B41M 2205/34 (2013.01); B41M 2205/36 (2013.01); B41M 2205/38 (2013.01); B41M 2205/40 (2013.01); H01L 51/0013 (2013.01)

(58) Field of Classification Search
CPC B41M 2205/40; H01L 51/00; H01L 51/0013; H01L 51/50; H01L 51/5012
USPC .............................................. 428/32.8, 32.81
See application file for complete search history.

(56) References Cited

FOREIGN PATENT DOCUMENTS

| KR | 10-2009-0071147 A | 7/2009 |
| KR | 10-2011-0008790 A | 1/2011 |
| KR | 10-2011-0058176 A | 6/2011 |
| KR | 10-2012-0138691 A | 12/2012 |

OTHER PUBLICATIONS

International Search Report dated Apr. 23, 2014, for Application No. PCT/KR2013/012261, 4 pages.

* cited by examiner

THERMAL TRANSFER FILM, AND ORGANIC ELECTROLUMINESCENT DEVICE PREPARED USING SAME

CROSS-REFERENCE TO RELATED APPLICATION(S)

This application is a National Stage of International Application No. PCT/KR2013/012261 filed Dec. 27, 2013, which claims priority to and the benefit of Korean Patent Application No. 10-2012-0157628, filed in the Korean Intellectual Property Office on Dec. 28, 2012, the entire contents of both of which are incorporated herein by reference.

TECHNICAL FIELD

The present invention relates to a thermal transfer film and an organic electroluminescent device prepared using the same. More particularly, the present invention relates to a thermal transfer film, which has good external appearance, exhibits high performance of thermal transfer, and does not suffer from reflection spots by controlling a location of a light-to-heat conversion material in a light-to-heat conversion layer in order to reduce surface roughness of the light-to-heat conversion layer, and to an organic electroluminescent device prepared using the same.

BACKGROUND ART

Recently, demand for thinner and higher performance products has increased in optical, display, semiconductor, bio-technology industries, and the like. To meet such demand, wires or functional thin films included in each component must be smaller and more uniformly patterned. For this purpose, a laser induced thermal imaging method using a light-to-heat conversion layer is widely used in a way that a transfer material (for example, an organic light emitting material) is stacked on the light-to-heat conversion layer absorbing light of a specific wavelength and converting the light into heat, followed by irradiation of light of a specific wavelength, thereby transferring the transfer material to a receptor. Generally, a thermal transfer film includes a light-to-heat conversion layer including a light-to-heat conversion material, which absorbs radiant light of a desired wavelength and converts at least portion of incident light into heat.

Typically, a thermal transfer film includes a base layer and a light-to-heat conversion layer on the base layer. The light-to-heat conversion layer is formed by curing a composition including a light-to-heat conversion material. However, since the light-to-heat conversion material is generally particle form and the light-to-heat conversion layer exhibits low surface roughness due to bad dispersibility in the course of curing the composition, the thermal transfer film can suffer from transfer failure. To solve such problems, an interlayer is additionally stacked on the light-to-heat conversion layer, thereby preventing transfer failure of the thermal transfer film. However, additional formation of the interlayer can cause reflection spots and deterioration in productivity due to multilayer structure, and has a limit in securing uniformity of surface roughness.

DISCLOSURE

Technical Problem

It is one aspect of the present invention to provide a thermal transfer film that has good surface roughness of the light-to-heat conversion layer and does not suffer from reflection spots.

It is another aspect of the present invention to provide a thermal transfer film that exhibits high performance of thermal transfer and excellent adhesion to the base layer.

It is a further aspect of the present invention to provide a thermal transfer film that exhibits high performance of thermal transfer in spite of a light-to-heat conversion layer in single layer form and has higher productivity.

Technical Solution

In accordance with one aspect of the present invention, a thermal transfer film may include a base layer; and a light-to-heat conversion layer formed on the base layer, wherein the light-to-heat conversion layer includes a first layer formed on the base layer and a second layer formed on the first layer in a thickness direction. Here, the first layer may include a light-to-heat conversion material more therein as compared with in the second layer.

In accordance with another aspect of the present invention, an organic electroluminescent device may be prepared using the thermal transfer film.

Advantageous Effects

The present invention provides a thermal transfer film that has good surface roughness of the light-to-heat conversion layer and does not suffer from reflection spots.

The present invention provides a thermal transfer film that exhibits high performance of thermal transfer and excellent adhesion to the base layer.

The present invention provides a thermal transfer film that exhibits high performance of thermal transfer in spite of a light-to-heat conversion layer in single layer form and has higher productivity.

BEST MODE

Embodiments of the present invention will now be described in detail with reference to the accompanying drawings. It should be understood that the present invention is not limited to the following embodiments and may be embodied in different ways, and that the embodiments are given to provide thorough understanding of the invention to those skilled in the art. Descriptions of unrelated components will be omitted for clarity. Like components will be denoted by like reference numerals throughout the specification.

As used herein, terms such as "upper side" and "lower side" are defined with reference to the accompanying drawings. Thus, it will be understood that the term "upper side" can be used interchangeably with the term "lower side". It will be understood that when an element such as a layer, film, region or substrate is referred to as being placed "on" or "above" another element, it can be directly placed on the other element, or an intervening layer(s) may also be present. On the other hand, when an element is referred to as being directly placed "on" another element, an intervening layer(s) is not present.

In accordance with one aspect of the present invention, a thermal transfer film includes a base layer; and a light-to-heat conversion layer formed on the base layer, wherein the light-to-heat conversion layer includes a first layer formed on the base layer and a second layer formed on the first layer in a thickness direction. Here, the light-to-heat conversion layer includes a light-to-heat conversion material and the light-to-heat conversion material may be more distributed in the first layer than the second layer.

Figure 1:
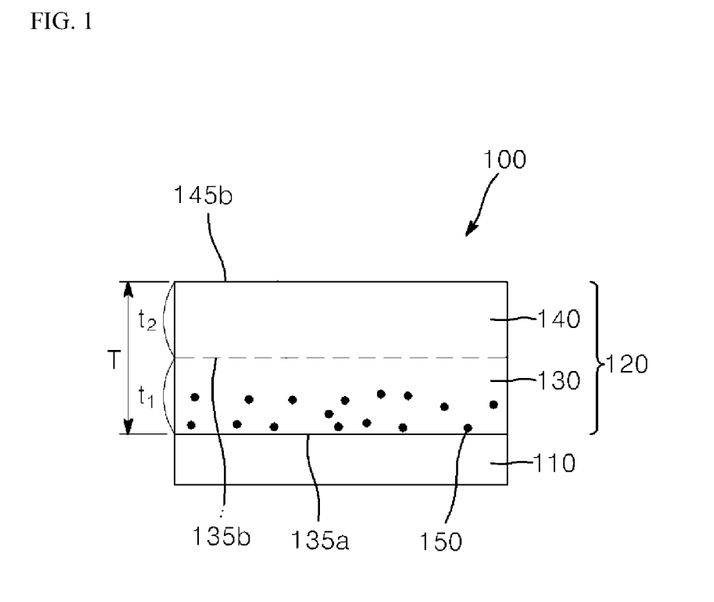
FIG. 1 is a cross-sectional view of a thermal transfer film according to one embodiment of the present invention.

FIG. 1 is a cross-sectional view of a thermal transfer film according to one embodiment of the present invention.

Referring to FIG. 1, a thermal transfer film 100 according to one embodiment may include: a base layer 110, and a light-to-heat conversion layer 120 formed on the base layer 110, wherein the light-to-heat conversion layer 120 may include a first layer 130 formed on the base layer 110 and a second layer 140 formed on the first layer 130 in a thickness direction, and the light-to-heat conversion layer 120 may include a light-to-heat conversion material 150 and the light-to-heat conversion material 150 may be more distributed in the first layer than the second layer. As used herein, the term more "distributed" may mean that the number, density or concentration of a light-to-heat conversion material per unit volume in a certain layer is greater than in another layer. As a result, the light-to-heat conversion layer can exhibit excellent properties in terms of surface roughness, thermal transfer and adhesion to the base layer, and can not suffer from reflection spots on an external appearance thereof.

In one embodiment, a ratio (C1/C2) of concentration (C1) of the light-to-heat conversion material of the first layer to concentration (C2) of the light-to-heat conversion material of the second layer is about 1.5 or more, preferably about 3 or more, more preferably about 5 to about 10. Within this range, the thermal transfer film can secure uniform transfer of the organic light emitting material.

The base layer 110 can exhibit good adhesion to the light-to-heat conversion layer, and can control heat transfer between the light-to-heat conversion layer and other layers. The base layer 110 may be formed of a transparent resin. Specifically, the base layer may be a film prepared from at least one of polyester resins, polyacrylic resins, polyepoxy resins, polyolefin resins including polyethylene resins or polypropylene resins, and polystyrene resins. The base layer may consist of a single layer or multiple layers so long as the base film is formed of such a material.

Specifically, the base layer may be a polyester film such as a polyethylene terephthalate (PET) or polyethylene naphthalate film.

The base layer may have a thickness from about 30 μm to about 300 μm, specifically from about 75 μm to about 125 μm. Within this range, the base layer can be used as a base layer of the thermal transfer film.

The light-to-heat conversion material may be more distributed in the first layer as compared with the second layer, and may be dispersed throughout the first layer.

The light-to-heat conversion layer 120 may include an upper surface 145b and a lower surface 135a in a thickness direction, and include the first layer 130 formed on the base layer 110 and the second layer 140 formed on the first layer 130.

The first layer 130 may be formed on the base layer 110, and include the lower surface 135a of the light-to-heat conversion layer 120 in the thickness direction. The first layer 130 may include the lower surface 135a of the light-to-heat conversion layer 120 and an interface 135b between the first and second layers 130, 140 in the thickness direction. The lower surface 135a of the first layer may correspond to a surface contacting the base layer 110.

The second layer 140 may be formed on the first layer 130 and include the upper surface 145b of the light-to-heat conversion layer 120. The second layer 140 may include the upper surface 145b of the light-to-heat conversion layer 120 and the interface 135b between the first and second layers 130, 140 in the thickness direction.

Figure 2:
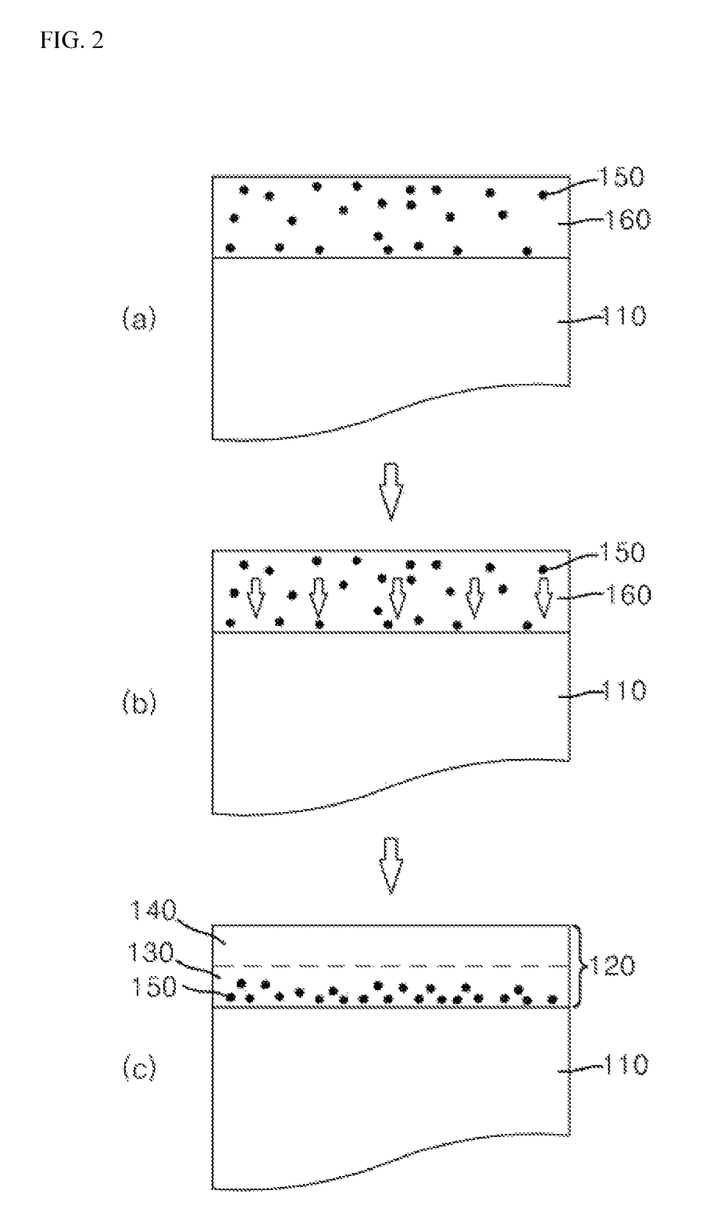
FIG. 2 is a conceptual diagram of a principle of formation of a thermal transfer film according to embodiments of the present invention.

FIG. 2 is a conceptual diagram of a principle of formation of a thermal transfer film according to one embodiment of the present invention.

Referring to FIG. 2(a), the base layer 110 is coated with a composition for a light-to-heat conversion layer including the light-to-heat conversion material 150, a UV curable resin, a polyfunctional monomer, an initiator and the like thereon, and as a result, a coating layer 160 for a light-to-heat conversion layer is formed on the base layer.

Referring to FIG. 2(b), when the coating layer 160 for a light-to-heat conversion layer is subjected to solvent drying and UV curing, the light-to-heat conversion material 150 moves towards the base layer 110 (in a direction of an arrow), and UV curable resin and the like move relatively towards a surface of the coating layer 160 in the thickness direction of the coating layer in the coating layer 160. That is, the light-to-heat conversion material can be moved due to repulsion between the light-to-heat conversion material and the UV curable resin. For example, when a hydrophilic light-to-heat conversion material (for example, carbon black) is mixed with a hydrophobic UV curable resin, followed by coating the mixture as a single layer, the light-to-heat conversion material sinks due to gravity. Thus, a single layer structure including first layer and second layer is obtained by coating of a single layer.

Referring to FIG. 2(c), when the coating layer 160 for a light-to-heat conversion layer of FIG. 2(b) is completely cured, the light-to-heat conversion layer 120 may be formed. Here, the light-to-heat conversion layer 120 includes the first layer 130, which includes the light-to-heat conversion material 150 more-distributed toward the base layer 110, and the second layer 140, which includes the light-to-heat conversion material 150 less distributed than the first layer 130.

The first layer and second layer are divided in the thickness direction of the light-to-heat conversion layer based on the extent which the light-to-heat conversion material is distributed therein, and may be formed of single (i.e. same) composition for a light-to-heat conversion layer. In one embodiment, the entirety of the first layer and second layer may be a single layer. The term 'single layer' means that any layer such as an adhesive layer and a coating layer is not formed between the first layer and second layer, and that the first layer and second layer are distinguished for convenience based on the extent which the light-to-heat conversion material is distributed therein.

The second layer is an outermost layer of the light-to-heat conversion layer, and a transfer layer may be stacked on the upper surface 145b of the second layer upon thermal transfer. Since the light-to-heat conversion material is not distributed or less distributed in the second layer of the thermal transfer film according to the invention, the second layer, particularly the upper surface 145b of the second layer, may have uniform and good surface roughness. As a result, the thermal transfer film can exhibit good external appearance upon stacking the transfer layer and thermal transfer, and thermal transfer can be performed while minimizing reflection spots.

Referring to FIG. 1, the light-to-heat conversion layer may have a thickness (T) from about 0.5 μm to about 10 μm, specifically from about 2 μm to about 5 μm. Within this range, the thermal transfer film can uniformly transfer the transfer layer.

Referring to FIG. 1, the first layer may have a thickness (t1) of about 20% to about 90% of a total thickness (T) of the light-to-heat conversion layer, preferably about 50% to about 80%. Within this range, the thermal transfer film can secure uniform transfer of the organic light emitting material.

The first layer may have a thickness from about 0.1 μm to about 10 μm, preferably from about 1 μm to about 4 μm. Within this range, the thermal transfer film can secure uniform transfer of the organic light emitting material.

Referring to FIG. 1, the second layer may be a portion formed on the first layer and having the transfer layer stacked thereon. Since the upper surface of the second layer has uniform surface roughness due to no distribution of the light-to-heat conversion material in the second layer, the transfer layer can be uniformly coated, and the thermal transfer film does not suffer from reflection spots and can exhibit uniform external appearance upon thermal transfer.

In one embodiment, referring to FIG. 1, the upper surface 145b of the second layer may have a surface roughness (Ra) of about 10 nm or less, preferably about 0 nm to 5.0 nm, more preferably about 0 nm to 0.5 nm. Within this range, the thermal transfer film can secure uniform transfer of the organic light emitting material.

The second layer may have a thickness (t2) of about 10% to about 80% of the total thickness (T) of the light-to-heat conversion layer, preferably about 20% to about 50%. Within this range, the thermal transfer film can secure uniform transfer of the organic light emitting material.

The second layer has a thickness from about 0.05 μm to about 10 μm, preferably from about 0.2 μm to about 2.5 μm. Within this range, the thermal transfer film can secure uniform transfer of the organic light emitting material.

The first and second layers may be formed of one composition for light-to-heat conversion layers.

The composition for light-to-heat conversion layers may include a UV curable resin, a polyfunctional monomer and a light-to-heat conversion material.

The UV curable resin may be a mono- or higher-functional, preferably di- or higher-functional, more preferably tri- or higher-functional, oligomer or pre-polymer.

Examples of the UV curable resin may include urethane resins having a relatively small molecular weight, polyester resins, polyether resins, acrylic resins, epoxy resins, alkyd resins, spiroacetal resins, polybutadiene resins, polythiolpolyene resins, (meth)acrylate resins of a polyfunctional compound of polyvalent alcohol, and the like.

Specifically, the UV curable resins may include polymethyl (meth)acrylate, amine-modified (meth)acrylate, epoxy (meth)acrylate, urethane (meth)acrylate, polyol poly(meth)acrylate, di(meth)acrylate of bisphenol A-diglycidyl ether, polyester (meth)acrylates capable of being obtained from polyvalent alcohols and polyvalent carboxylic acid or anhydrides thereof and (meth)acrylic acid, polysiloxane poly(meth)acrylate, and the like. These compounds may be used alone or as mixtures thereof.

The polyfunctional monomer may be a di-functional to hexa-functional monomer. Preferably, the polyfunctional monomer may be a tri-functional to pentafunctional monomer. The polyfunctional monomer may be a polyfunctional (meth)acrylate, for example, a polyfunctional (meth)acrylate containing a hydroxyl group, a fluorine-modified polyfunctional (meth)acrylate, or a mixture thereof, without being limited thereto.

The polyfunctional monomers may be used alone or in combination thereof.

The polyfunctional (meth)acrylate may be trimethylolpropane tri(meth)acrylate, dipentaerythritol penta(meth)acrylate, dipentaerythritol hexa(meth)acrylate, pentaerythritol tri(meth)acrylate, pentaerythritol tetra(meth)acrylate, di(trimethylolpropane)tetra(meth)acrylate, tris(2-hydroxyethyl)isocyanurate tri(meth)acrylate, hexanediol di(meth)acrylate, dicyclodecanedimethanol di(meth)acrylate, or mixtures thereof.

The fluorine modified polyfunctional (meth)acrylate may be a polyfunctional (meth)acrylate obtained by fluorine modification of the polyfunctional (meth)acrylate monomer.

The light-to-heat conversion material may be a material which may absorb light and convert the light into heat, and may be a liquid, solid, or the like. Preferably, the light-to-heat conversion material may be solid particles.

The light-to-heat conversion material may include at least one of carbon black, tungsten oxide, dyes, and pigments.

Carbon black may have an average particle size from about 50 nm to about 500 nm. Within this range, the thermal transfer can secure uniform transfer of the organic light emitting material. The term "average particle size" means "an average of particle sizes of carbon black". The average particle size may be measured using a particle size analyzer in accordance with ASTM D3849.

The tungsten oxide may include at least one of tungsten oxide and tungsten composite oxide. The tungsten oxide may be represented by $W_yO_z$, (wherein W is tungsten; O is oxygen; and 2.2≤a ratio of z to y (z/y)≤3.0). Examples of the tungsten oxide may include $WO_3$, $W_{18}O_{49}$, $W_{20}O_{58}$, $W_4O_{11}$, and the like. The tungsten composite oxide may be represented by $M_xW_yO_z$ (wherein M is at least one element selected from among H, He, alkali metals, alkali earth metals, rare earth elements, halogen, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, P, S, Se, Te, Ti, Nb, V, Mo, Ta, Re, Hf, Os, and Bi; W is tungsten; O is oxygen; 0.001≤a ratio of x to y (x/y)≤1.1; and 2.2≤a ratio of z to y (z/y)≤3.0).

The alkali metal may be Li, Na, K, Rb, Cs, or Fr.

The alkali earth metal may be Be, Mg, Ca, Sr, Ba, Ra, or the like.

The rare earth element may be Sc, Y, La, Ce, Pr, Nd, Pm, Sm, Eu, Gd, Tb, Dy, Ho, Er, Tm, Yb, Lu, or the like.

Halogen may be F, Cl, Br, or I.

Since fine particles of the tungsten composite oxide exhibit excellent durability when having a hexagonal, tetragonal or cubic crystal structure, the fine particles of the tungsten composite oxide may include at least one of hexagonal, tetragonal and cubic crystal structures. For example, the fine particles of the tungsten composite oxide having a hexagonal crystal structure may include at least one selected from among Cs, Rb, K, Ti, In, Ba, Li, Ca, Sr, Fe and Sn as the M element.

Here, the M element is present in an amount of x such that x/y preferably ranges from 0.001 to 1.1, more preferably 0.33±0.3. The reason is that a theoretical value of x/y calculated from the hexagonal crystal structure is 0.33. Within this range, the thermal transfer film can exhibit good optical properties.

In addition, oxygen is preferably present in an amount of z such that z/y ranges from 2.2 to 3.0. Although typical examples of the tungsten composite oxide may include $Cs_{0.33}WO_3$, $Rb_{0.33}WO_3$, $Ba_{0.33}WO_3$ and the like, any tungsten composite oxide can exhibit useful near-infrared absorption properties so long as x, y and z of the tungsten composite oxide satisfy the above conditions.

Fine tungsten oxide particles may have an average particle diameter of greater than 0 nm to 500 nm or less, preferably greater than 0 nm to about 400 nm or less, more preferably from about 10 nm to about 200 nm. Within this range, the tungsten oxide can be more easily prepared, and the thermal transfer film can exhibit effective thermal properties in thermal transfer.

Any dye or pigment capable of converting absorbed light into heat upon irradiation with light in a wavelength range from about 400 nm to about 1500 nm may be used without limitation. For example, the dye or pigment may be selected from the group consisting of diimmonium dyes, metal-complex dyes, naphthalocyanine dyes, phthalocyanine dyes, polymethine dyes, anthraquinone dyes, porphyrin dyes, cyanine dyes having a metal-complex form, carbon black dyes, metal oxide dyes, metal sulfide dyes, graphite pigments, and mixtures thereof.

The composition for a light-to-heat conversion layer may further include an initiator. The initiator may be a photo initiator typically used in the art. For example, the initiator may be a benzophenone compound such as 1-hydroxycyclohexyl phenyl ketone, without being limited thereto.

The composition may include about 10% by weight (wt %) to about 80 wt % of the UV curable resin, about 5 wt % to about 50 wt % of the polyfunctional monomer, about 5 wt % to about 50 wt % of the light-to-heat conversion material, and about 0.1 wt % to about 10 wt % of the initiator in terms of solid content. Within this range, the thermal transfer film can secure uniform transfer of the organic light emitting material. Preferably, the composition may include about 50 wt % to about 70 wt % of the UV curable resin, about 25 wt % to about 35 wt % of the polyfunctional monomer, about 10 wt % to about 30 wt % of the light-to-heat conversion material, and about 0.5 wt % to about 7 wt % of the initiator. In one embodiment, the composition may include about 55 wt % to about 60 wt % of the UV curable resin, about 25 wt % to about 30 wt % of the polyfunctional monomer, about 10 wt % to about 14 wt % of the light-to-heat conversion material, and about 1 wt % to about 5 wt % of the initiator.

The composition may further include a solvent. The solvent may include at least one of methylethylketone and propyleneglycolmonomethylether acetate.

The composition may further include at least one of a curable fluorine compound and a curable siloxane compound. The term 'curable' may mean UV curable. In one embodiment, the curable fluorine compound may include fluorine-modified polyfunctional (meth)acrylate obtained by reacting a compound having a perfluoro group with a polyfunctional (meth)acrylate. In one embodiment, the curable fluorine compound may include a compound represented by Formula 1:

$(CH_2=CR^1COO)_nR^f$      [Formula 1]

(wherein n is an integer of 1 or more;

$R^1$ is hydrogen, or a $C_1$ to $C_5$ linear or branched alkyl group; and is a $C_2$ to $C_{50}$ linear or branched fluoroalkyl group, a $C_2$ to $C_{50}$ linear or branched perfluoroalkyl group, a $C_2$ to $C_{50}$ linear or branched fluoroalkylene group or a $C_2$ to $C_{50}$ linear or branched perfluoroalkylene group).

Preferably, n may be an integer of 2 or more, more preferably from 2 to 20.

In one embodiment, $R^f$ may be represented by any one of Formulae a to e:

(wherein * is a bonding site; $R^{F1}$ is a $C_1$ to $C_{10}$ linear or branched perfluoroalkylene group; and $R^{F2}$, $R^{F3}$, $R^{F4}$ and $R^{F5}$ are each hydrogen, or a $C_1$ to $C_{14}$ linear or branched perfluoroalkyl group).

The curable siloxane compound may be polyether-modified dialkyl polysiloxane containing a (meth)acrylate group. The curable siloxane compound may be synthesized by a typical method, or may be commercially purchased. For example, the curable siloxane compound may be a polyether-modified dialkyl polysiloxane (BYK3700, BYK Chemie CO., Ltd.), without being limited thereto.

The curable fluorine compound, curable siloxane compound or a mixture thereof may included in an amount of about 0.01 wt % to about 10 wt %, preferably about 0.1 wt % to about 5 wt % in the composition in terms of solid content. Within this range, the thermal transfer film can secure uniform transfer of the organic light emitting material.

In one embodiment, the composition may include about 10 wt % to about 80 wt % of the UV curable resin, about 5 wt % to about 50 wt % of the polyfunctional monomer, about 5 wt % to about 50 wt % of the light-to-heat conversion material, about 0.1 wt % to about 10 wt % of the initiator, and about 0.01 wt % to about 10 wt % of at least one of the curable fluorine compound and the curable siloxane compound in terms of solid content. Preferably, the composition may includes about 50 wt % to about 70 wt % of the UV curable resin, about 15 wt % to about 35 wt %, preferably about 20 wt % to about 35 wt % of the polyfunctional monomer, about 10 wt % to about 30 wt % of the light-to-heat conversion material, about 0.5 wt % to about 7 wt % of the initiator and about 0.1 wt % to about 5 wt % of at least one of the curable fluorine compound and the curable siloxane compound. More preferably, the composition may include about 55 wt % to about 60 wt % of the UV curable resin, about 25 wt % to about 30 wt % of the polyfunctional monomer, about 10 wt % to about 14 wt % of the light-toheat conversion material, about 1 wt % to about 5 wt % of the initiator and about 0.1 wt % to about 5 wt % of at least one of the curable fluorine compound and the curable siloxane compound.

The light-to-heat conversion layer may further include a transfer layer thereon. The transfer layer may include at least one layer to transfer a transfer material, for example, an organic light emitting material, to a receptor, for example, a substrate. The at least one layer may be formed using organic, inorganic, organometallic, and other materials, which include electroluminescent or electrically active materials. The transfer layer may be coated as a uniform layer by evaporation, sputtering or solvent coating, or may be printed in pattern form using digital printing, lithography or evaporation, or sputtering through a mask.

The thermal transfer film may not include an interlayer. Even though the thermal transfer film does not include the interlayer, the thermal transfer film can exhibit high thermal transfer performance due to low surface roughness of the light-to-heat conversion layer.

Figure 3:
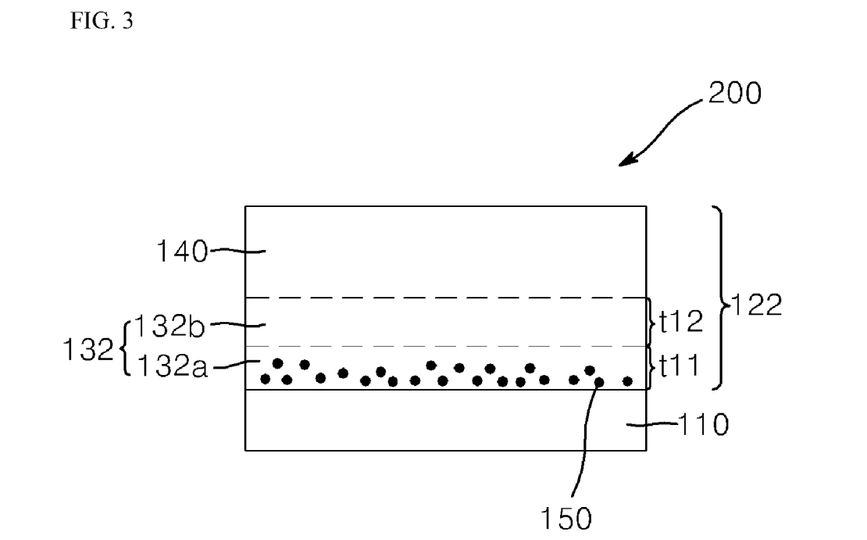
FIG. 3 is a cross-sectional view of a thermal transfer film according to another embodiment of the present invention.

Hereinafter, a thermal transfer film according to another embodiment of the invention will be described in detail with reference to FIG. 3. FIG. 3 is a cross-sectional view of a thermal transfer film according to another embodiment of the present invention.

Referring to FIG. 3, a thermal transfer film 200 according to another embodiment may include a base layer 110; and a light-to-heat conversion layer 122 stacked on the base layer 110, wherein the light-to-heat conversion layer 122 may include a first layer 132 formed on the base layer 110 and a second layer 140 formed on the first layer 132 in a thickness direction. Here, the light-to-heat conversion layer 122 may include a light-to-heat conversion material 150, the light-to-heat conversion material 150 may be more distributed in the first layer 132 than in the second layer 140, such that the light-to-heat conversion material is more distributed toward the base layer 110 and not distributed toward the second layer 140, and the first layer 132 may include a first region 132a and a second region 132b, the light-to-heat conversion material is more distributed in the first region 132a than the second region 132b in the thickness direction. That is, the first region may be a region between an upper side of the base layer and a lower side of the second region, and the second region may be a region between an upper side of the first layer and a lower side of the second layer. The thermal transfer film according to this embodiment is substantially the same as that according to the above embodiment except that the light-to-heat conversion material is dispersed only in the first region instead of being dispersed throughout the first layer.

In the first layer, a ratio (C12/C11) of concentration (C12) of the light-to-heat conversion material in the second region to concentration (C11) of the light-to-heat conversion material in the first region is about 0.67 or less, preferably about 0.33 or less, more preferably about 0.1 or less, still more preferably about 0.01 to about 0.1.

In the first layer, a ratio (t12/t11) of thickness (t12) of the second region to thickness (t11) of the first region may be about 5 or less, preferably from about 0.2 to about 1 in the thickness direction thereof.

The first layer including the first and second regions may be a single layer. The term "single layer" means that any intervening layer such as an adhesive layer and a coating layer is not formed between the first and second regions, and that the first and second regions consist of the same components and are classified for convenience based on the extent to which the light-to-heat conversion material is distributed.

Figure 4:
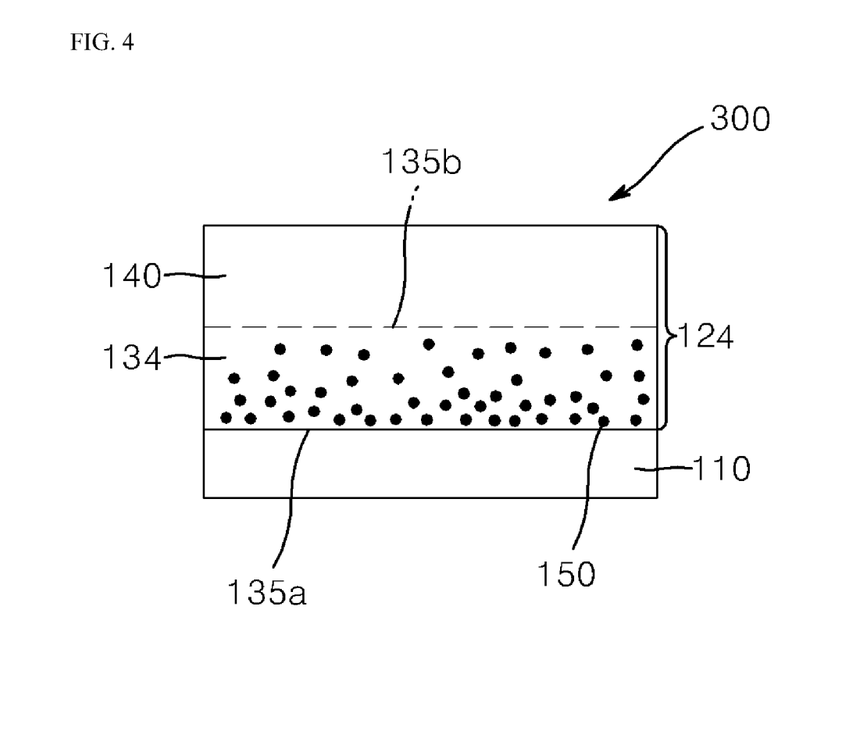
FIG. 4 is a cross-sectional view of a thermal transfer film according to a further embodiment of the present invention.

FIG. 4 is a cross-sectional view of a thermal transfer film according to a further embodiment of the present invention.

Referring to FIG. 4, a thermal transfer film 300 according to a further embodiment may include a base layer 110; and a light-to-heat conversion layer 124 stacked on the base layer 110, wherein the light-to-heat conversion layer 124 may include a first layer 134 formed on the base layer 110 and a second layer 140 formed on the first layer 134 in a thickness direction, and the light-to-heat conversion layer 124 may include a light-to-heat conversion material 150, the light-to-heat conversion material 150 may be more distributed in the first layer 132 than in the second layer 140, the first layer 132 may have a concentration gradient of the light-to-heat conversion material 150 such that the concentration of the light-to-heat conversion material 150 gradually increases with increasing distance from an interface 135b between the first and second layers to a lower surface 135a of the first layer (that is, a surface contacting the base layer). The thermal transfer film according to this embodiment is substantially the same as that of the above embodiment except that the light-to-heat conversion material has a concentration gradient in the first layer instead of being dispersed throughout the first layer.

In accordance with another aspect of the present invention, a method of preparing a thermal transfer film may include: coating a composition for a light-to-heat conversion layer, which includes a light-to-heat conversion material, a UV curable resin, a polyfunctional monomer and an initiator, onto a base layer; and curing the composition.

Details of the base layer, the light-to-heat conversion material, the UV curable resin, the polyfunctional monomer and the initiator are the same as described above.

Curing may be performed by drying the composition at about 70° C. to about 100° C. for about 1 minute to about 5 minutes, followed by irradiation at an intensity of about 100 mJ/cm$^2$ to about 500 mJ/cm$^2$.

In accordance with a further aspect of the present invention, an organic electroluminescent device may be prepared using the thermal transfer film. The thermal transfer film may be used as a donor film in preparation of the organic electroluminescent device, and the organic electroluminescent device may be prepared using the thermal transfer film by a typical method.

For example, after a donor film having an EML formed therein is prepared by stacking an organic light emitting material on the thermal transfer film, a substrate and the donor film are laminated, followed by patterning through laser irradiation, thereby preparing an organic electroluminescent device.

Mode for Invention

Hereinafter, the present invention will be described in more detail with reference to some examples. However, it should be noted that these examples are provided for illustration only and are not to be construed in any way as limiting the present invention.

Example 1

14.51 g of polymethylmethacrylate (Elvacite2694, Lucite Co., Ltd.) and 41.28 g of a hydrophobic aliphatic urethane acrylate oligomer (CN9026, Sartomer Co., Ltd.) as UV curable resins, 27.62 g of a pentafunctional acrylate monomer (SR399, Sartomer Co., Ltd.) as a polyfunctional monomer, and 2.55 g of Irgacure 184 (BASF Co., Ltd.) as a photo initiator were added to a solvent mixture of 30.07 g of methylethylketone and 19.52 g of propyleneglycolmonomethyletheracetate, followed by stirring for 30 minutes. 11.55 g of hydrophilic carbon black (Aqua-Black162, Tokai Carbon Co., Ltd.) was added to the mixture, followed by stirring the resulting material for 30 minutes, thereby preparing a composition for a light-to-heat conversion layer.

The composition was bar-coated onto a PET film (A4100, Toyobo Co., Ltd., thickness: 100 μm), which was a base film, followed by drying at 80° C. for 2 minutes. A 3.0 μm thick light-to-heat conversion layer was formed on the base film by curing the composition at 300 mJ/cm$^2$ in a nitrogen atmosphere, thereby preparing a thermal transfer film.

Example 2

14.51 g of polymethylmethacrylate (Elvacite2694, Lucite Co., Ltd.) and 41.28 g of an epoxy acrylate binder (CN136, Sartomer Co., Ltd.) as UV curable resins, 27.62 g of a pentafunctional acrylate monomer (SR399, Sartomer Co., Ltd.) as a polyfunctional monomer, 2.49 g of an acrylic group-containing polyether-modified dimethyl polysiloxane (BYK3700, BYK Chemie Co., Ltd.) as a UV curable siloxane compound, and 2.55 g of Irgacure 184 (BASF Co., Ltd.) as a photo initiator were added to a solvent mixture of 70.15 g of methylethylketone and 39.05 g of propylene glycolmonomethyletheracetate, followed by stirring for 30 minutes. 11.55 g of hydrophilic carbon black (Aqua-Black162, Tokai Carbon Co., Ltd.) was added to the mixture, followed by stirring the resulting material for 30 minutes, thereby preparing a composition for a light-to-heat conversion layer.

The composition was bar-coated onto a PET film (A4100, Toyobo Co., Ltd., thickness: 100 μm), which was a base film, followed by drying at 80° C. for 2 minutes. A 3.0 μm thick light-to-heat conversion layer was formed on the base film by curing the composition at 300 mJ/cm$^2$ in a nitrogen atmosphere, thereby preparing a thermal transfer film.

Example 3

14.51 g of polymethylmethacrylate (Elvacite2694, Lucite Co., Ltd.) and 41.28 g of an epoxy acrylate binder (CN136, Sartomer Co., Ltd.) as UV curable resins, 27.62 g of a pentafunctional acrylate monomer (SR399, Sartomer Co., Ltd.) as a polyfunctional monomer, 2.49 g of 1H,1H,10H,10H-perfluoro-1,10-decandiol diacrylate (Exfluor Research Corporation) as a UV curable fluorine compound, and 2.55 g of Irgacure 184 (CIBA Co., Ltd.) as a photo initiator were added to a solvent mixture of 70.15 g of methylethylketone and 39.05 g of propyleneglycol monomethylether acetate, followed by stirring for 30 minutes. 11.55 g of hydrophilic carbon black (Aqua-Black162, Tokai Carbon Co., Ltd.) was added to the binder mixture, followed by stirring the resulting material for 30 minutes, thereby preparing a composition for a light-to-heat conversion layer.

The composition was bar-coated onto a PET film (A4100, Toyobo Co., Ltd., thickness: 100 μm), which was a base film, followed by drying at 80° C. for 2 minutes. A 3.0 μm thick light-to-heat conversion layer was formed on the base film by curing the composition at 300 mJ/cm$^2$ in a nitrogen atmosphere, thereby preparing a thermal transfer film.

Comparative Example 1

25 g of polymethylmethacrylate (Elvacite2694, Lucite Co., Ltd.) and 40 g of an epoxy acrylate binder (CN136, Sartomer Co., Ltd.) as UV curable resins, 17 g of a pentafunctional acrylate monomer (SR399, Sartomer Co., Ltd.) as a polyfunctional monomer, and 3 g of Irgacure 184 (BASF Co., Ltd.) as a photo initiator were mixed with a solvent mixture of 70.15 g of methylethylketone and 39.05 g of propyleneglycolmonomethyletheracetate, thereby preparing a binder mixture. 15 g of carbon black (hydrophobic) was added to the binder mixture, followed by stirring the resulting material for 30 minutes, thereby preparing a composition for a light-to-heat conversion layer.

The composition was bar-coated onto a PET film (A4100, Toyobo Co., Ltd., thickness: 100 μm), which was a base film, followed by drying at 80° C. for 2 minutes. A 3.0 μm thick light-to-heat conversion layer was formed on the base film by curing the composition at 300 mJ/cm$^2$ in a nitrogen atmosphere, thereby preparing a thermal transfer film.

Comparative Example 2

25 g of polymethylmethacrylate (Elvacite2694, Lucite Co., Ltd.) and 40 g of an epoxy acrylate binder (CN136, Sartomer Co., Ltd.) as UV curable resins, 17 g of a pentafunctional acrylate monomer (SR399, Sartomer Co., Ltd.) as a polyfunctional monomer, and 3 g of Irgacure 184 (BASF Co., Ltd.) as a photo initiator were mixed with a solvent mixture of 70.15 g of methylethylketone and 39.05 g of propyleneglycolmonomethyletheracetate, thereby preparing a binder mixture. 15 g of carbon black (hydrophobic) was added to the binder mixture, followed by stirring the resulting material for 30 minutes, thereby preparing a composition for a light-to-heat conversion layer.

The composition was bar-coated onto a PET film (A4100, Toyobo Co., Ltd., thickness: 100 μm), which was a base film, followed by drying at 80° C. for 2 minutes. The composition was cured at 300 mJ/cm$^2$ in a nitrogen atmosphere, thereby forming a light-to-heat conversion layer having a thickness of 3.0 μm.

13.08 g of polymethyl methacrylate (Elvacite2694, Lucite Co., Ltd.) and 17.99 g of an epoxy acrylate binder (CN136, Sartomer Co., Ltd.) as UV curable resins, and 7.44 g of a pentafunctional acrylate monomer (SR399, Sartomer Co., Ltd.) as a polyfunctional monomer were added to a solvent mixture of 47.15 g of methylethylketone and 26.05 g of propyleneglycolmonomethylether acetate, followed by stirring for 30 minutes. 1.5 g of Irgacure 184 (BASF Co., Ltd.) as a photo initiator was added to the resulting material, followed by stirring for 30 minutes, thereby preparing a composition for an interlayer.

The composition was bar-coated onto the light-to-heat conversion layer, followed by drying in an oven of 80° C. for 2 minutes. The composition was cured at 300 mJ/cm$^2$ in a nitrogen atmosphere, thereby preparing a thermal transfer film including an interlayer having a thickness of 3.0 μm.

Experimental Example (1) OD value: Optical density (OD) was measured on the thermal transfer films prepared in Examples and Comparative Examples using a Perkin Elmer Lambda 950 UV-VIS spectrometer at a wavelength of 1064 nm.

(2) Surface roughness (Ra, average roughness, nm): Average roughness Ra was measured on a surface of the light-to-heat conversion layer (Examples 1 to 3 and Comparative Example 1) or the interlayer (Comparative Example 2), which was a final coating layer of the thermal transfer film using an Atomic Force Microscope (AFM). Surface roughness of a donor film was measured in a 20 μm×20 μm scale using an XE-100 (Park System Co., Ltd.).

(3) External appearance: External appearance was observed using a Nikon Eclips L150 optical microscope with a focus on the light-to-heat conversion layer.

(4) Reflection spots: Rainbow spots was observed by the naked eye using light emitted from a three-wavelength lamp and reflected by the light-to-heat conversion layer, and rated according to the following three grades. No reflection spot was rated as "⊚", slight reflection spots were rated as "○", and severe reflection spots were rated as "X".

TABLE 1

|  | Example 1 | Example 2 | Example 3 | Comparative Example 1 | Comparative Example 2 |
|---|---|---|---|---|---|
| OD value | 1.20 | 1.21 | 1.20 | 1.20 | 1.21 |
| Surface roughness (Ra, nm) | 0.118 | 0.372 | 0.141 | 28.371 | 0.157 |
| External appearance | Good | Good | Good | Good | Good |
| Reflection spots | ⊚ | ○ | ○ | ⊚ | X |

As shown in Table 1, the thermal transfer films according to the invention had low surface roughness, and thus exhibited excellent external appearance and did not suffer from reflection spots. Thus, the present invention provided the thermal transfer film, which exhibited excellent properties in terms of surface uniformity of the light-to-heat conversion layer, thermal transfer performance and adhesion to the base layer, and did not suffer from reflection spots on the external appearance. The present invention provides a thermal transfer film, which exhibits excellent thermal transfer performance and high productivity despite the single light-to-heat conversion layer.

Conversely, since the thermal transfer film of Comparative Example 1 had high surface roughness and caused non-uniform transfer of an organic light emitting device, the organic light emitting device might exhibit deteriorated efficiency and lifespan.

In addition, although the thermal transfer film of Comparative Example 2 which included the interlayer had low surface roughness, the thermal transfer film of Comparative Example 2 suffered from severe reflection spots due to multilayer coating.

It should be understood that various modifications, changes, alterations, and equivalent embodiments can be made by those skilled in the art without departing from the spirit and scope of the invention.

The invention claimed is:

1. A thermal transfer film comprising:
a base layer; and
a light-to-heat conversion layer formed on the base layer, the light-to-heat conversion layer comprising a cured product of a composition for a light-to-heat conversion layer, the composition comprising a UV curable resin, a polyfunctional monomer, a light-to-heat conversion material and an initiator,
wherein the light-to-heat conversion layer includes a first layer stacked on the base layer and a second layer stacked on the first layer in a thickness direction,
the light-to-heat conversion material is more distributed in the first layer than in the second layer, and wherein the second layer has a surface roughness (Ra) of about 10 nm or less on its upper surface.

2. The thermal transfer film according to claim 1, wherein a ratio (C1/C2) of concentration (C1) of the light-to-heat conversion material in the first layer to concentration (C2) of the light-to-heat conversion material in the second layer is about 1.5 or more.

3. The thermal transfer film according to claim 1, wherein the first layer has a thickness of about 20% to about 90% of a total thickness of the light-to-heat conversion layer.

4. The thermal transfer film according to claim 1, wherein the first layer has a thickness of about 0.1 μm to about 10 μm, and the second layer has a thickness of about 0.05 μm to about 10 μm.

5. The thermal transfer film according to claim 1, wherein the light-to-heat conversion material is dispersed throughout the first layer.

6. The thermal transfer film according to claim 1, wherein the first layer comprises a first region and a second region in the thickness direction, and the light-to-heat conversion material is more distributed in the first region than in the second region.

7. The thermal transfer film according to claim 6, wherein a ratio (t12/t11) of thickness (t12) of the second region to thickness (t11) of the first region is about 5 or less.

8. The thermal transfer film according to claim 1, wherein the light-to-heat conversion material has a gradually increasing concentration with increasing distance from an interface between the first layer and second layer to a lower surface of the first layer.

9. The thermal transfer film according to claim 1, wherein the light-to-heat conversion material comprises at least one of a dye and a pigment.

10. The thermal transfer film according to claim 1, wherein the light-to-heat conversion material has a particle shape.

11. A thermal transfer film comprising:
a base layer; and
a light-to-heat conversion layer formed on the base layer, the light-to-heat conversion layer comprising a cured product of a composition for a light-to-heat conversion layer, the composition comprising a UV curable resin, a polyfunctional monomer, a light-to-heat conversion material and an initiator,
wherein the light-to-heat conversion layer is a single layer having a first region adjacent the base layer in a thickness direction and a second region adjacent the first region in a thickness direction, and
the light-to-heat conversion material is more distributed in the first region than in the second region, and wherein the second region has a surface roughness (Ra) of about 10 nm or less on its upper surface.

12. The thermal transfer film according to claim 1, wherein the composition comprises about 10 wt % to about 80 wt % of the UV curable resin, about 5 wt % to about 50 wt % of the polyfunctional monomer, about 5 wt % to about 50 wt % of the light-to-heat conversion material and about 0.1 wt % to about 10 wt % of the photo initiator in terms of solid content.

13. The thermal transfer film according to claim 1, wherein the composition further comprises at least one of a curable fluorine compound and a curable siloxane compound.

14. The thermal transfer film according to claim 13, wherein the curable fluorine compound is represented by Formula 1:

<Formula 1>

(wherein n is an integer of 2 or more;

$R^1$ is hydrogen, or a $C_1$ to $C_5$ linear or branched alkyl group; and $R^f$ is represented by any one of Formulae a to e:

<Formula a>
<Formula b>
<Formula c>
<Formula d>
<Formula e>

(wherein * is a bonding site;

$R^{F1}$ is a $C_1$ to $C_{10}$ linear or branched perfluoroalkylene group; and $R^{F2}$, $R^{F3}$, $R^{F4}$ and $R^{F5}$ are each hydrogen, or a $C_1$ to $C_{14}$ linear or branched perfluoroalkyl group)).

15. The thermal transfer film according to claim 13, wherein the curable siloxane compound comprises polyether-modified dialkyl polysiloxane containing a (meth) acrylic group.

16. The thermal transfer film according to claim 13, wherein the composition comprises about 10 wt % to about 80 wt % of the UV curable resin, about 5 wt % to about 50 wt % of the polyfunctional monomer, about 5 wt % to about 50 wt % of the light-to-heat conversion material, about 0.1 wt % to about 10 wt % of the photo initiator and about 0.01 wt % to about 10 wt % of the at least one of the curable fluorine compound and the curable siloxane compound in terms of solid content.

17. The thermal transfer film according to claim 1, wherein the base layer comprises a film formed of at least one of polyester resins, polyacrylic resins, polyepoxy resins, polyolefin resins, and polystyrene resins.

18. The thermal transfer film according to claim 1, wherein the light-to-heat conversion layer comprises a transfer layer stacked thereon.

19. The thermal transfer film according to claim 1, wherein the light-to-heat conversion material comprises at least one of carbon black and tungsten oxide.

20. An organic electroluminescent device prepared using the thermal transfer film according to claim 1 as a donor film.

* * * * *